(12) United States Patent
Perin (10) Patent No.: US 9,139,898 B2
(45) Date of Patent: Sep. 22, 2015

(54) METHOD AND SYSTEM FOR MANUFACTURING A TARGET FOR THE EMISSION OF PHOTON RADIATION, PARTICULARLY X RAYS, OR OF PARTICLES, PARTICULARLY PROTONS OR ELECTRONS, BY LASER FIRING

(71) Applicant: Commissariat A L'Energie Atomique Et Aux Energies Alternatives, Paris (FR)

(72) Inventor: Jean-Paul Perin, Seyssins (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/187,685

(22) Filed: Feb. 24, 2014

(65) Prior Publication Data

US 2014/0287140 A1    Sep. 25, 2014

(30) Foreign Application Priority Data

Mar. 20, 2013    (FR) ..................... 13.52501

(51) Int. Cl.
| | |
|---|---|
| C23C 14/22 | (2006.01) |
| H05G 2/00 | (2006.01) |
| C23C 14/04 | (2006.01) |
| C23C 14/14 | (2006.01) |
| C23C 14/50 | (2006.01) |
| C23C 14/54 | (2006.01) |
| H01J 35/08 | (2006.01) |

(52) U.S. Cl.
CPC ............ *C23C 14/228* (2013.01); *C23C 14/042* (2013.01); *C23C 14/14* (2013.01); *C23C 14/505* (2013.01); *C23C 14/541* (2013.01); *H05G 2/001* (2013.01); *H01J 35/08* (2013.01); *H01J 2235/085* (2013.01)

(58) Field of Classification Search
None
See application file for complete search history.

(56) References Cited

U.S. PATENT DOCUMENTS

| | | | | |
|---|---|---|---|---|
| 3,959,685 | A | * 5/1976 | Konieczynski | ............... 378/144 |
| 2001/0007708 | A1 | * 7/2001 | Venkataramani et al. | ..... 428/139 |
| 2007/0087117 | A1 | * 4/2007 | Jabado et al. | ................ 427/97.7 |
| 2008/0157011 | A1 | 7/2008 | Nagai et al. | |

FOREIGN PATENT DOCUMENTS

| | | |
|---|---|---|
| JP | 05-258692 A1 | 10/1993 |
| JP | 2006-332552 A1 | 12/2006 |

OTHER PUBLICATIONS

French Search Report (Application No. 13.52501) dated Nov. 25, 2013.

* cited by examiner

*Primary Examiner* — Joseph Miller, Jr.
(74) *Attorney, Agent, or Firm* — Burr & Brown, PLLC (57) ABSTRACT

A method of manufacturing a target for the generation of radiation of photons, protons or electrons by means of a laser, including: forming a support including first and second surfaces connected by openings, and forming in an enclosure a layer of material on the first surface by protecting the first surface with a protection element, injecting into the enclosure a gas of filling material, adjusting the pressure in the enclosure and the temperature of the support to form plugs of material in the openings of the support, and maintaining the temperature of the support and the pressure in the enclosure at values to maintain the plugs, followed by withdrawing the protection element from the first surface, and forming a layer of metallic material on the first surface of the support and on the plugs. The pressure and support temperature are then modified to remove the plugs.

15 Claims, 5 Drawing Sheets

METHOD AND SYSTEM FOR MANUFACTURING A TARGET FOR THE EMISSION OF PHOTON RADIATION, PARTICULARLY X RAYS, OR OF PARTICLES, PARTICULARLY PROTONS OR ELECTRONS, BY LASER FIRING

FIELD OF THE INVENTION

The invention relates to the emission of X rays, or of particles, particularly protons and electrons, and more particularly to the manufacturing of targets used in such an emission.

BACKGROUND

A known principle of X-ray generation comprises focusing a laser beam on a solid metal target, preferably a metal having a high atomic number, for example, gold, copper, or any other dense metal. The interaction of the laser beam and of the metal thus generates a plasma and a mono-energetic X-ray emission, which are particularly used in mammography or angiography. The target is generally placed in a vacuum enclosure, where the laser/matter interaction takes place, and is mounted on a mobile support, for example, a rotating support, so that each laser firing impacts a portion of the target which has not been impacted by a previous firing.

When the metal target has a large thickness, particularly greater than 500 nanometer, the X rays are emitted in the half-space where the laser beam propagates. It is then spoken of a "retro-emission". However, when the metal target has a small thickness, particularly a thickness smaller than 500 nanometers, the rays are emitted in the direction of the laser beam and are accordingly emitted by the surface of the metal target opposite to that impacted by the laser beam. It is then spoken of a "transmission" emission.

Usually, thin metal targets are obtained by depositing a metal layer on a copper or plastic support, after which the substrate is removed by means of a chemical bath and/or of a plasma etching. The layer thus exposed is then washed, for example, in water or alcohol, to remove a maximum amount of impurities, after which the target is mounted on the mobile support, and the support is mounted in the enclosure.

Such a manufacturing is long and the substrate removal step is besides very delicate. It is further necessary to introduce the target and its support into the enclosure, which assumes breaking the vacuum existing therein, and then reforming the vacuum, which also takes a long time. In practice, the time of use of an X-ray emission system is very limited, and its down time is long.

Similar problems are posed for the generation of particles, for example, electrons and protons, by means of a laser firing on a thin target.

BRIEF DESCRIPTION OF THE INVENTION

The present invention aims at providing a method of manufacturing a target for the generation of photon or particle radiation, particularly the generation of X rays, electrons, or protons, which does not require removing a physical support of the metal target, and which can be directly used in a vacuum enclosure, and particularly the vacuum enclosure used for the radiation or particle emission.

For this purpose, the invention aims at a method of manufacturing a target for the generation of photon or particle radiations by means of a laser, comprising:

forming a support comprising a first and a second surfaces and crossed by openings; and
forming in a tight enclosure a layer of material on the first surface of the support.

According to the invention, the forming of the layer of material on the support comprises:
protecting the first surface of the support with a protection element;
injecting into the enclosure a gas of filling material;
adjusting the pressure in the enclosure and the temperature of the support to form solid plugs of filling material in the openings of the support;
stopping the injection of the gas of filling material into the enclosure;
maintaining the temperature of the support and the pressure in the enclosure at values maintaining the plugs solid in the openings of the support, and jointly to said maintaining:
withdrawing the protection element from the first surface of the support to expose said surface; and
forming the layer of material on the first surface of the support and on the solid plugs filling the openings;
modifying the conditions of pressure in the enclosure and of support temperature to clear the openings of the support of the solid plugs.

In other words, a solid support is formed by filling preexisting openings of the support, the layer, for example, metallic, forming the target is formed on the solid support thus created, after which the material for filling the openings is removed. The portions of the metal layer covering the openings then form the areas of the target which are subsequently impacted by the laser beam to produce rays (X) or particles (protons or electrons). The support is thus not removed and may for example directly be the mobile support used to expose to the laser beam areas of the target which are free or any impact. Further, the filling material in solid form may be easily removed once the layer has been deposited, for example, by modifying the pressure in the enclosure and/or the support temperature to sublimate the filling material.

Further, the filling material may be introduced in gaseous form into the vacuum enclosure used for the emission of rays or particles, and the layer of material may be directly formed in this enclosure by means, for example, of a physical vapor deposition.

According to an embodiment, the first surface of the support is planar, and the protection thereof comprises placing the first surface of the support against a planar solid surface.

According to an embodiment, the placing of the support in contact with the gas comprises placing the support in a tight enclosure have a predetermined low pressure and cooling the support to a temperature lower than the temperature of the triple point of the material forming the gas.

According to an embodiment, the layer of material is deposited on the first surface of the support by means of a physical vapor deposition. The vapor phase of the metal is for example produced by the ohmic heating of a support having a solid mass of the metal resting thereon or by the electronic bombarding of a target made of the metal.

Particularly, the tight enclosure comprises means capable of injecting the gas into the enclosure, means capable of adjusting the internal pressure thereof, means capable of adjusting the temperature of the support to temperatures lower than the triple point of the material forming the gas, and means capable of vaporizing a solid metal element placed in contact therewith. Further, the placing into contact of the support with the gas, the forming of the plugs filling the support openings, and the physical vapor deposition are performed in the enclosure by maintaining a low pressure, particularly lower than $10^{-3}$ mbar.

According to an embodiment, the withdrawal of the protection element from the first surface of the support comprises heating said support to separate the element from the solid plugs filling the openings of the support and drawing the protection element away from the first surface of the support.

According to an embodiment, the clearing of the support openings comprises adjusting the support temperature and/or the pressure in the enclosure. Particularly, the support is reheated above the sublimation point of the filling material and the enclosure is maintained at a pressure lower than the saturation pressure corresponding to the support temperature.

According to an embodiment, the filling material is argon, nitrogen, krypton, or xenon.

According to an embodiment, the layer of material is metallic. More specifically, the thickness of the layer of metallic material is smaller than or equal to 500 nanometers, and preferably smaller than or equal to 50 nanometers.

As a variation, a layer of material comprises a metal layer and a dihydrogen or deuterium layer. More specifically, the metal layer has a thickness in the range from 20 nanometers to 100 nanometers, and the dihydrogen or deuterium layer has a thickness in the range from 20 nanometers to 100 nanometers.

According to an embodiment, the openings of the support are truncated cones widening from the first surface of the support to the second surface of the support.

According to an embodiment, openings of the support are arranged in a circle and angularly spaced apart in regular fashion.

The invention also aims at a system for implementing a method of manufacturing a target for the generation of radiation, particularly X rays or particles, particularly of protons or electrons by means of a laser, of the previously-mentioned type, comprising:

a tight enclosure;
a support and means for positioning the support in the enclosure;
a protection element and means for positioning the protection element in the enclosure between a withdrawal position and a position where the protection element is placed against the surface of the support;
means for pumping the internal volume of the enclosure;
means for controlling the support temperature;
means for injecting gas into the enclosure;
means for heating the protection element; and
means for vaporizing a metallic element in the enclosure.

According to an embodiment, the means for positioning the support in the enclosure comprise means for rotating said support.

According to an embodiment, the enclosure comprises a window transparent to the laser beam arranged in front of the support surface.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION

Figure 1:
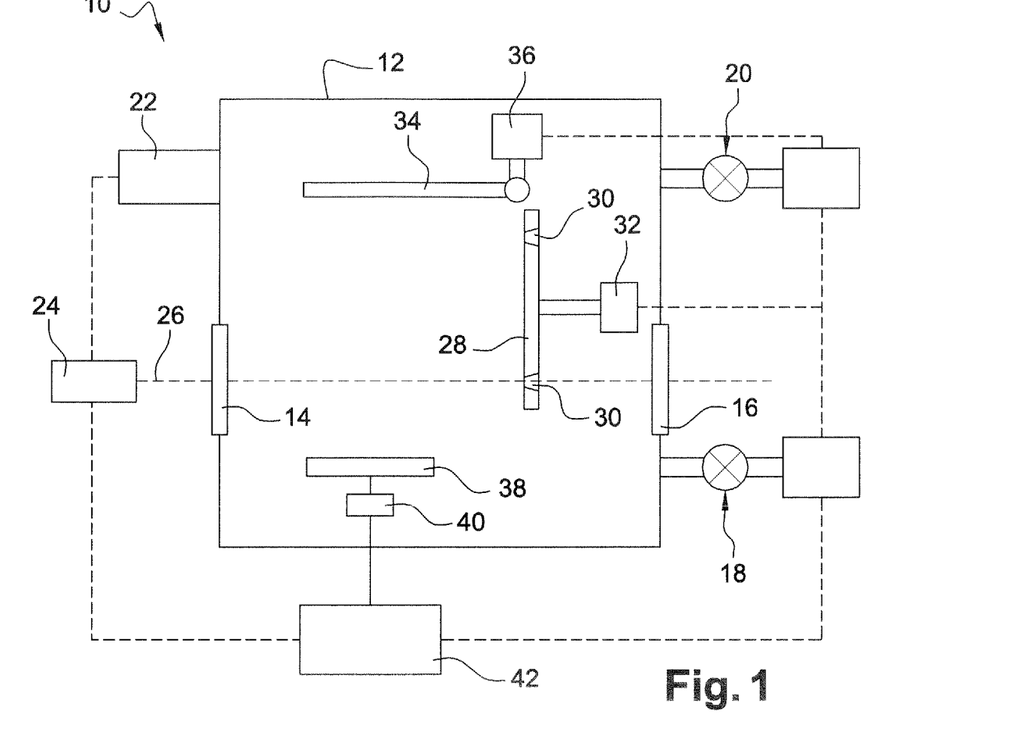
FIG. 1 is a simplified view of a system according to the invention for producing a target for X rays and for producing X rays.

In relation with FIG. 1, a system 10 according to the invention enabling to form a metal target for the generation of X rays and to generate X rays from a single vacuum enclosure will now be described.

System 10 particularly comprises:

a tight enclosure 12 comprising a first wall portion forming a first window 14 transparent to a laser beam, and a second wall portion forming a second window 16 transparent to X rays and arranged in front of first window 14. Tight enclosure 12 further comprises a heat shield enabling to limit heat inputs by radiation from the surrounding environment and from the elements internal to the enclosure having their temperature maintained high, for example, close to 300 K, for their operation.

a pumping circuit 18 of enclosure 12, capable of creating therein a low pressure, particularly lower than $10^{-3}$ mbar, and more particularly a pressure lower than or equal to $10^{-4}$ mbar;

an injection circuit 20 capable of injecting gas into enclosure 12;

a circuit 22 for controlling the temperature of enclosure 12 capable of establishing in enclosure 12 a low temperature, particularly a temperature lower than 100 K. Advantageously, circuit 22 also comprises a cold source, preferably having a temperature lower than the temperature of the triple point of a filling material, capable of discharging the heat flows generated in enclosure 12, particularly the flows generated by a process of deposition of a metal layer formed in enclosure 12, as will be described in further detail hereafter; and a laser 24 capable of performing laser firings through first window 14 along a beam axis 26.

System 10 also comprises, in enclosure 12:

a planar support 28 thoroughly crossed by openings 30;

a first circuit for displacing support 32 capable of displacing said support to position each of openings 30 on laser beam axis 26, as will be explained in further detail hereafter;

a solid plate 34, for example of same dimensions as support 28;

a second displacement and heating circuit 36, capable of displacing plate 34 between a storage position, where plate 34 does not disturb the subsequent deposition of a metal layer on support 28, and a protection position, where plate 34 is placed against support 28 to close openings 30 and prevent the condensation on the surface of support 28 having plate 34 placed against it. Circuit 36 is further capable of heating plate 34. Circuit 36 is for example capable of delivering a heat pulse to plate 34 and/or plate 34 is metallic and circuit 36 is capable of injecting a current therein to cause a heating by Joule effect;

a support 38 capable of receiving a metal layer to be evaporated; and a circuit 40 for heating support 38 to take the support to a temperature greater than the evaporation temperature of the metal deposited on support 38.

Temperature control circuit 22 also comprises a circuit for controlling the temperature of support 28, and particularly means for cooling support 28, for example, ducts in contact therewith, and/or inside thereof, and having gaseous helium flowing therethrough, and/or a cryorefrigerator comprising a connection by metal braids or by thermosyphon, and means for heating support 28, for example a regulated electric heating.

Finally, system 10 comprises a unit 42 controlling the operation of the elements which have just been described according to a plurality of phases described hereafter.

Figure 2:
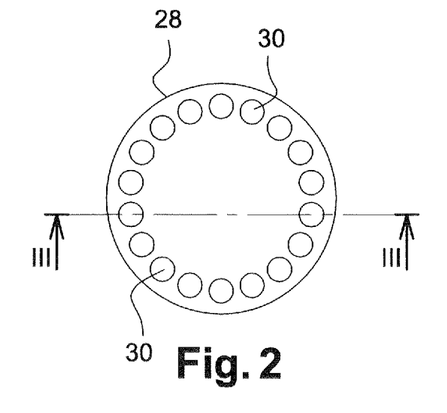
FIGS. 2 and 3 respectively are simplified top and cross-section views of a support for a target according to the invention.
Figure 3:
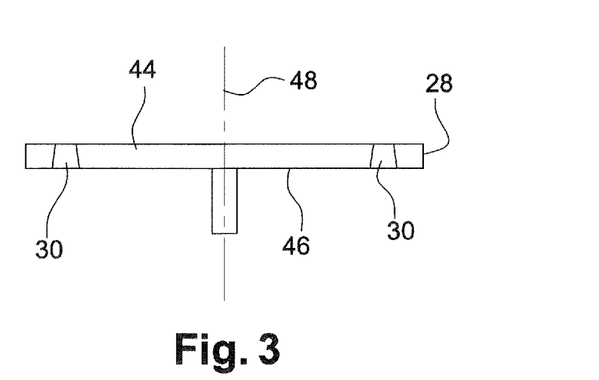

Referring to FIGS. 2 and 3, support 28 for example takes the shape of a disk where openings 30 are positioned in a circle and angularly spaced apart in regular fashion. Advantageously, openings 30 have millimetric or submillimetric dimensions and have a truncated cone cross-section which widens from surface 44 of support 28 facing window 14 of enclosure 12 to surface 46 facing window 16 of enclosure 12, to conform to the angle of divergence of the X-ray beam produced on impact of laser firings.

Advantageously, support 28 is made of silicon or germanium, such materials being very good heat conductors, which enables to easily control the support temperature. Further, a silicon or germanium support may be significantly polished. More specifically, surface 44 of support 28 is polished to have very few roughnesses, and particularly to have a so-called "optical quality" polish, which provides a subsequent metal deposition on surface 44 of substantially constant thickness.

Circuit 32 for displacing support 28 for example comprises a step-by-step electric motor to rotate support 28 around an axis 48 perpendicular to the main plane of support 28, and running through the center of the circle having openings 30 positioned thereon. Circuit 32 thus enables to position each of openings 30 on axis 26 of the laser beam emitted by laser 24.

In relation with FIGS. 4 to 9, a method according to the invention of forming a metal target for the generation of X rays and generating the X rays implemented by system 10 will now be described.

Figure 4:
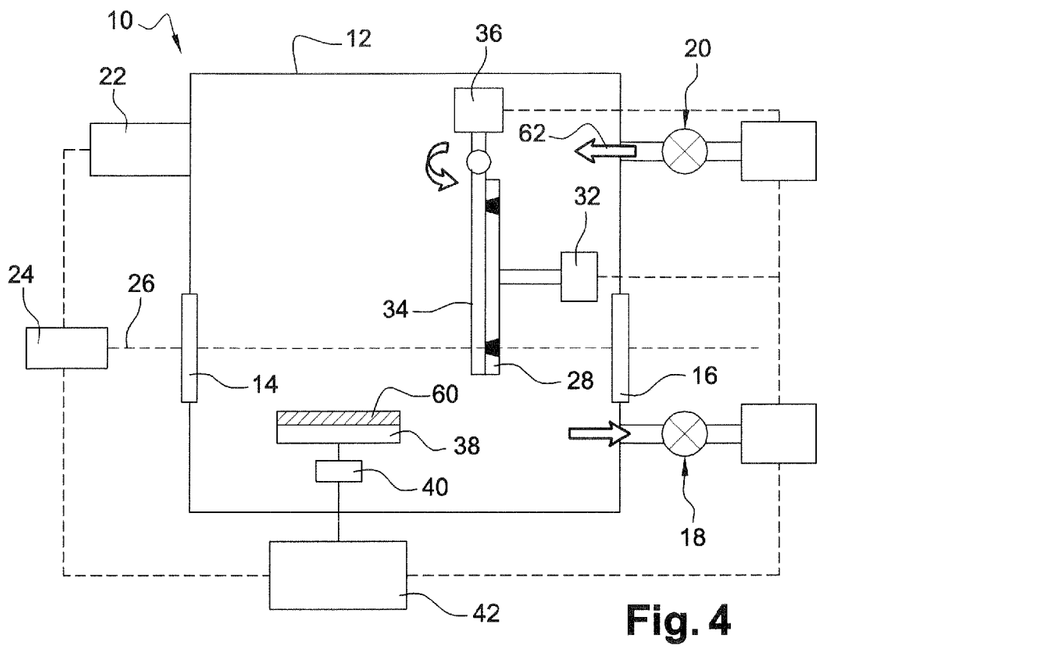
FIGS. 4 to 9 are simplified views illustrating different phases of the operation of the system of FIG. 1 to implement a method according to the invention.

In a first step of the method, a metal layer 60 is positioned on support 38, the metal of layer 60 being that forming the target for the subsequently performed X-ray generation (FIG. 4). The metal of layer 60 is for example tantalum, tungsten, gold, or copper. Control unit 42 further controls displacement and heating circuit 36 to place plate 34 against support 28.

Consecutively or simultaneously, unit 42 controls pumping circuit 18 and temperature control circuit 22 to create and maintain a pressure and a temperature in enclosure 12 such that:
  support 28 and plate 34 have a temperature lower than the temperature of the triple point of a material for filling openings 30 subsequently introduced into enclosure 12 in gaseous form; and
  the pressure in enclosure 12 is maintained at a pressure lower than the saturation vapor pressure of the filling material corresponding to the temperature of support 28 to avoid any parasitic condensation.

Once the pressure and the temperature of enclosure 12 have been adjusted, unit 42 then controls injection circuit 20 so that the latter injects into enclosure 12 filling material 62 in gaseous form. Filling material 62 particularly is argon, nitrogen, krypton, xenon, or a mixture thereof. Due to the pressure and temperature conditions in enclosure 12 which are adjusted according to injected gas 62, the latter condenses in solid form in openings 30.

Once openings 30 have been filled with solid material 62, unit 42 controls the stopping of the gas injection into enclosure 12. Advantageously, unit 42 controls pumping circuit 18 to lower the pressure in enclosure 12 and temperature control circuit 22 to lower the temperature of support 28 by a few Kelvin to guarantee the maintaining of the plugs in the solid state during a subsequent heat inflow from plate 34 and a metal deposition on support 28 and avoid the self-evaporation of the plugs.

Figure 5:
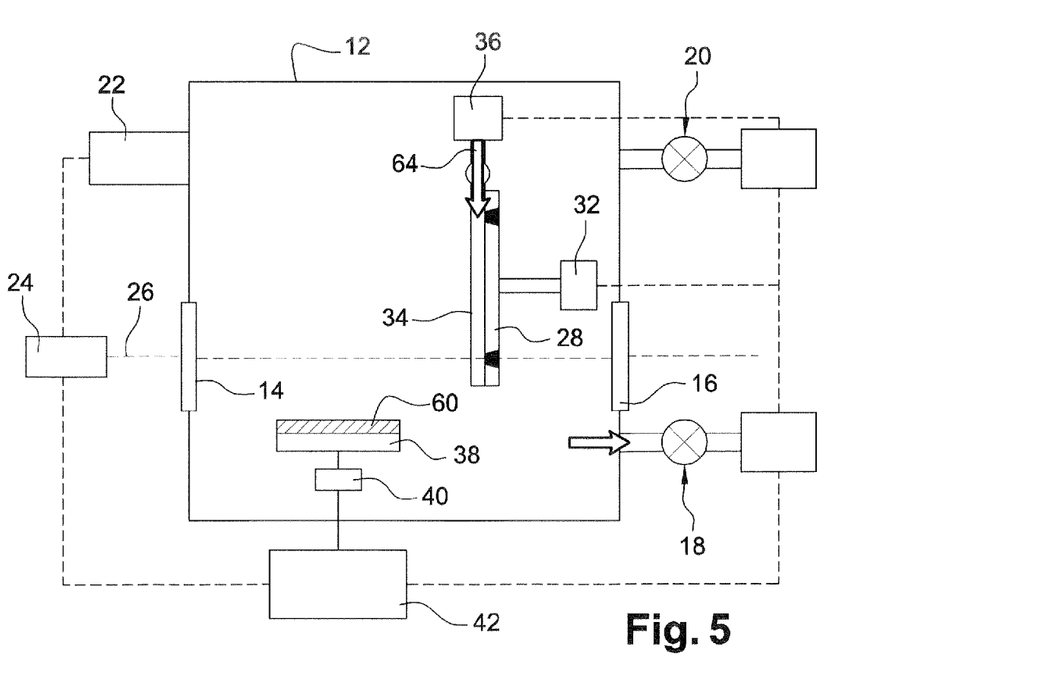
Figure 6:
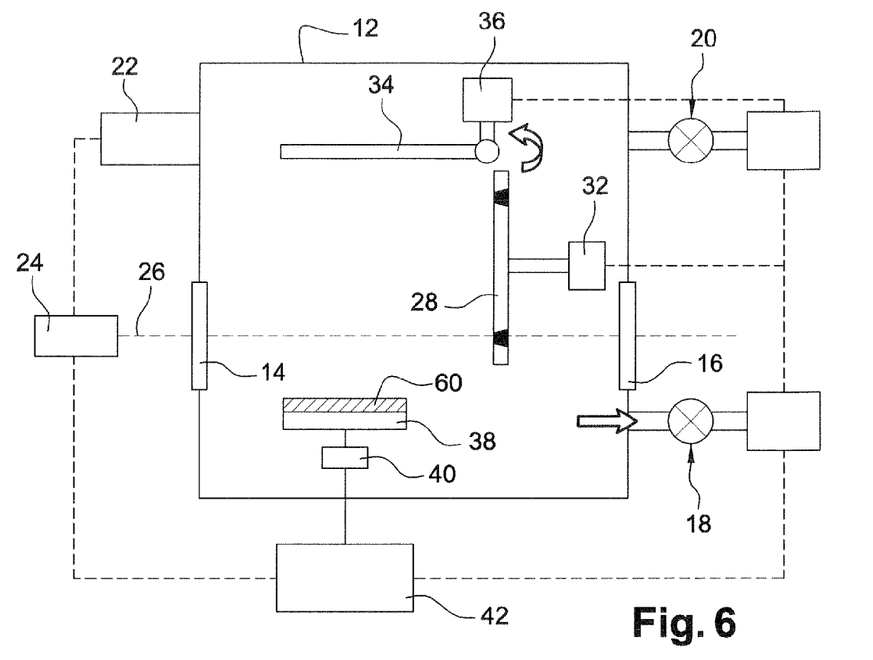

Unit 42 then controls displacement and heating circuit 36 so that it heats plate 34. Plate 34 then separates from material 62 filling openings 30 of support 28 (FIG. 5). Unit 42 then controls displacement and heating circuit 36 to position plate 34 in its storage posit (FIG. 6).

In a next step, unit 42 controls heating circuit 40 so that the temperature of support 38 is higher than the evaporation temperature of the metal of layer 60 laid on support 38. A physical vapor deposition is then implemented. More specifically, vaporized metal 64 deposits on surface 44 of support 28 and on plugs 62 of solid material filling openings 30 (FIG. 7), thus forming a metal layer 66.

Figure 7:
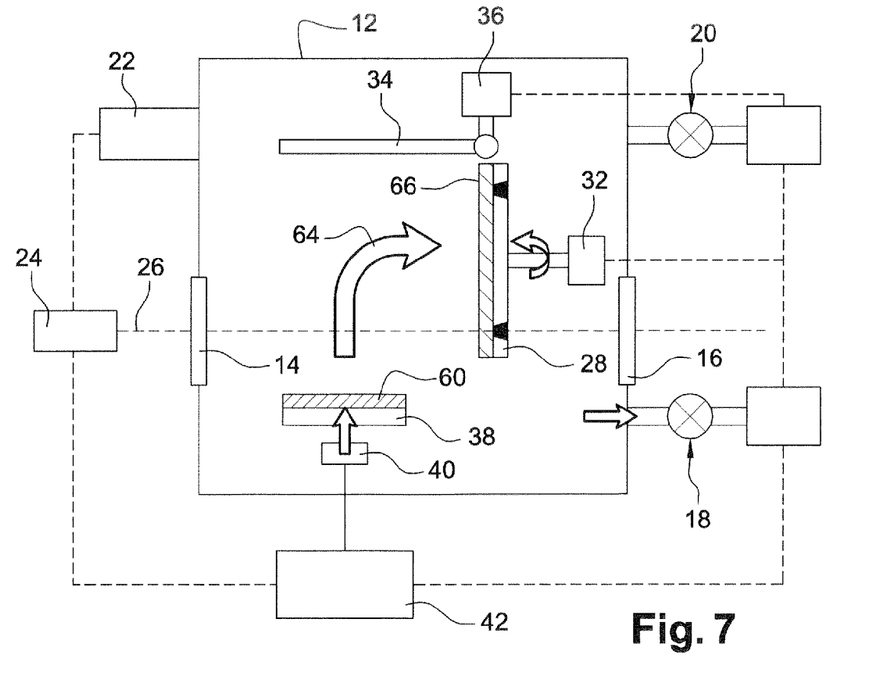

Once the thickness desired for metal layer 66 has been obtained, particularly a thickness smaller than or equal than 500 nanometers, and preferably a thickness smaller than or equal to 50 nanometers, to implement an X-ray emission by transmission, unit 42 controls the stopping of the heating of support 38 and accordingly the stopping of the metal deposition on support 28.

Figure 8:
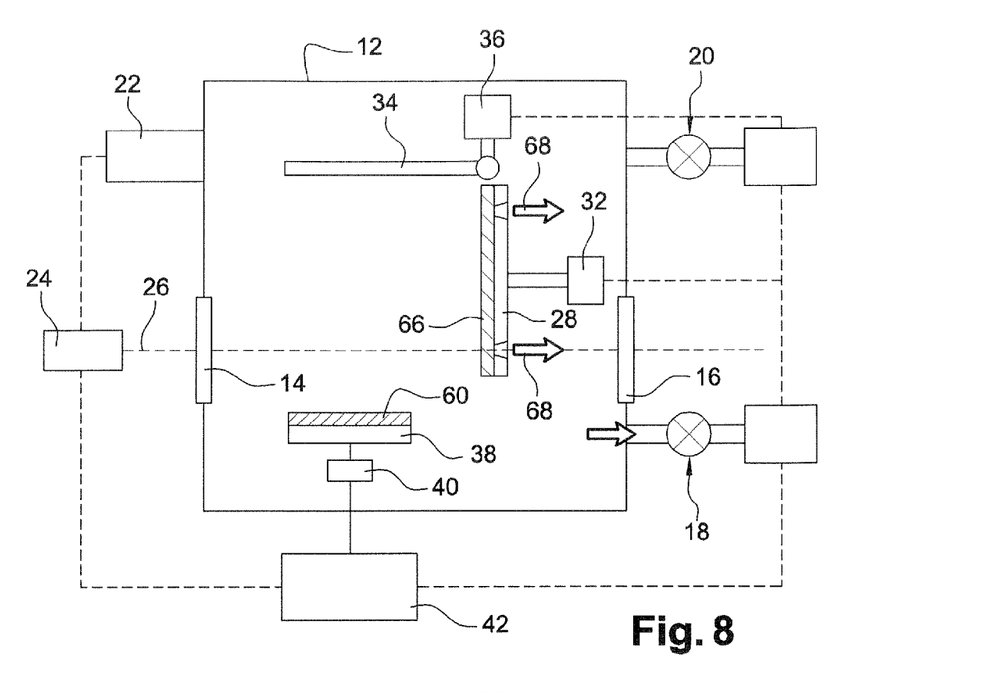
Figure 10:
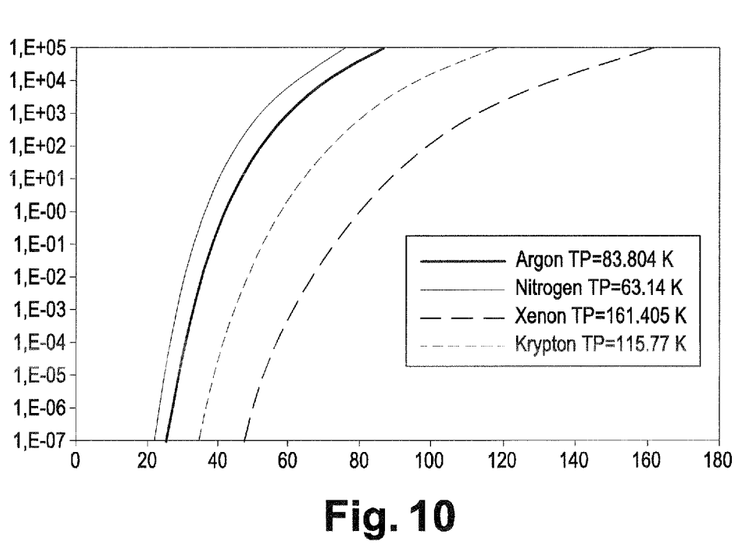
FIG. 10 shows saturation curves of different gases of filling material for temperatures lower than the triple point of these gases.

Unit 42 then controls pumping circuit 18 and temperature control circuit 22 to remove material 62 filling openings 30 of support 28, preferably by sublimation. More specifically, unit 42 controls circuit 22 to adjust the temperature of support 28 to a temperature greater than the saturation vapor temperature of the filling material corresponding to the pressure in enclosure 12 maintained constant. Thus, the temperature of the solid plugs crosses the saturation vapor pressure curve of the filling material as illustrated in FIG. 10, so that the solid plugs sublimate. Sublimated material 68 is then pumped by pumping circuit 18 and discharged from enclosure 12 (FIG. 8).

Figure 9:
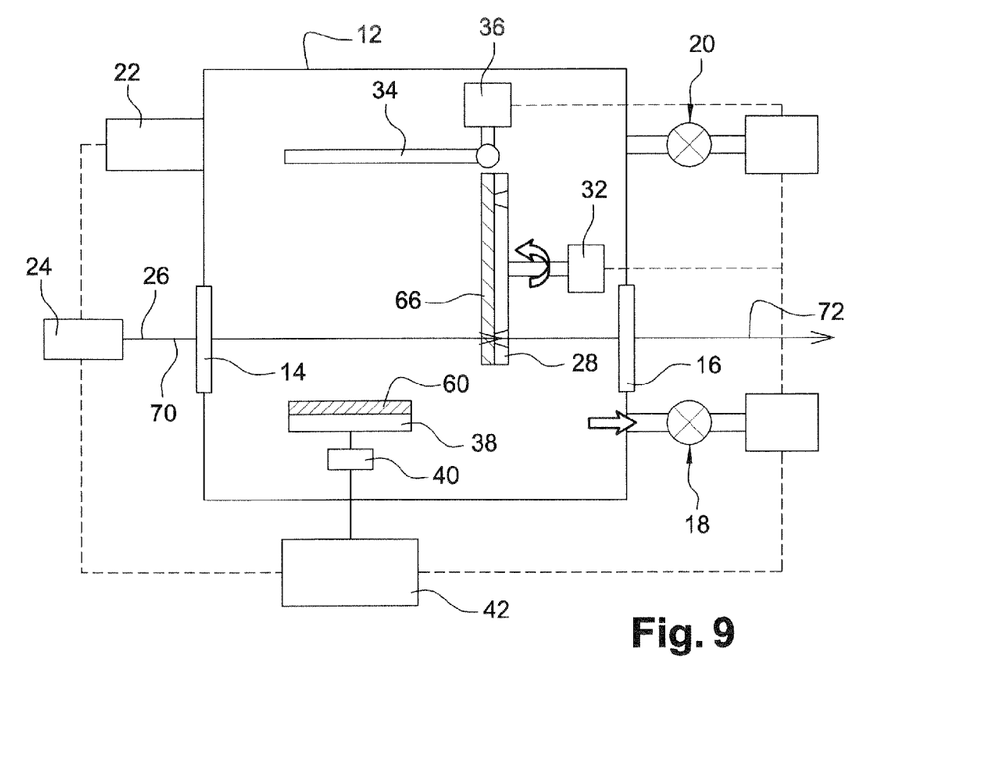

Finally, once openings 30 have been cleared of filling material 62, unit 42 controls laser 24 and displacement circuit 32 to cause laser firings 70 through window 14 on the portions of metal layer 66 arranged on openings 30 of support 28, particularly on portions which have received no impact. For each laser firing, a beam of monochromatic X-rays 72 is then generated along axis 26 of the laser beam, said beam being emitted towards the outside of enclosure 12 through window 16.

For example, for a filling material formed of argon, the temperature of support 28 and of plate 34 is selected from range [30 K, 40 K] and the pressure of the enclosure is substantially selected to be equal to $10^{-4}$ mbar.

Advantageously, the selection of the filling material and the selection of the adjustments of the pressure in the enclosure and of the support temperature are performed as follows. First, the filling material is selected according to support 28 to obtain a homogeneous metal deposition. Particularly, if the support comprises a crystal lattice, the filling material is selected so that its solid phase is also crystalline so that the metal target deposition is performed on a homogeneous surface.

Once the filling material has been selected, the support temperature is selected for a pressure in the enclosure lower than $10^{-3}$ mbar, for example, 25 K for nitrogen, 35 K for argon, 52 K for xenon, or 75 K for krypton, and the gas of filling material is introduced into the enclosure. The pressure in the enclosure is thus increased, particularly to be in the range from $10^{-3}$ mbar to $5.10^{-3}$ mbar to solidify the gas and fill the support openings. Once the openings have been filled, the gas injection is stopped and the pressure is lowered back to a value lower than $10^{-3}$ mbar.

During the metal deposition of the target on the support, the temperature is lowered by a few Kelvin and the pressure in the enclosure is lowered by some $10^{-4}$ mbar to limit phenomena of evaporation by heat inflow and self-evaporation. When the deposition of the target on the support is finished, the support temperature is then raised by a few Kelvin to cause the sublimation of the filling material present in the openings.

In a first variation, when target 66 is worn out, enclosure 12 is opened and support 28 is removed along with worn-out target 66. A new support 28 is then introduced into enclosure 12 for a new target manufacturing and X-ray production cycle, as described previously.

In a second variation, circuit 22 for controlling the temperature of support 28 is capable of raising the temperature thereof to cause the total evaporation of worn-out target 66. The evaporated metal is then pumped by pumping circuit 18 and a new target manufacturing cycle can then be implemented without having to break the vacuum in enclosure 12.

A specific embodiment where the target support comprises openings according to a specific arrangement has been described. Of course, the invention applies to any type of support and of opening arrangement.

A plate which is placed against the support during the filling of the openings to, particularly, protect the surface of the support having the condensation target subsequently deposited thereon, has been described. Other protection elements may however be envisaged. Particularly, a second mobile protection element, for example, a second solid plate, is provided to be placed against the surface of support 28 opposite to the surface against which protection element 34 is capable of being placed. The second protection element is placed against support 28 on deposition of the metal layer to protect the rear surface from a parasitic deposition on the plugs filling openings 30. The second protection element is advantageously connected to a displacement and heating circuit for displacing and heating said circuit.

Similarly, an embodiment where the forming of the solid plugs in the openings of the target support, the withdrawal of the protection plate, and the deposition of the target on the support are carried out at a constant pressure and temperature has been described. During these phases, the pressure and the temperature may vary within a whole range enabling to keep the plugs filling the support openings in their solid form. Similarly, different temperatures and pressures may be selected during the X-ray generation.

The deposition of a single metallic material on support 28 has been described. As a variation, a plurality of metal layers are successively deposited on support 28. For this purpose, the system according to the invention for example comprises several supports 38 having their temperature controlled independently from one another by a heating circuit 40 provided for and connected to each support 38 or by a single heating circuit 40 connected to each support 38. Different metallic materials may thus be deposited on supports 38, and unit 42 controls heating circuit 40 to deposit successive metallic layers on support 28 in a predetermined order. Once the deposition of the different metal layers has been performed, the filling material present in openings 30 of support 28 is then removed, as described previously, and the laser firings can take place.

As a variation or additionally, once the metal layer has been deposited, for example, first layer, the second protection element is placed against support 28, for example, after the plugs filling openings 30 of support 28 have been removed, before the deposition of the next metal layer(s), which particularly avoids the deposition of metal in openings 30. Thereby, the deposition conditions are less restrictive since it is no longer necessary to adjust the pressure and the temperature in the enclosure to keep the plugs solid.

For example, the next metal layer(s) may be deposited by condensation in solid form of a gas injected into the enclosure via injection circuit 20, the pressure and the temperature of the enclosure being controlled to obtain such a condensation.

The forming of a metal target for the generation of X rays has been described. The invention also applies to the manufacturing of non-metal or partially metallic ultra-thin targets, such as for example targets used in particle accelerators. For example, the targets comprise a solid deuterium or dihydrogen layer in addition to or instead of a metal layer. Laser firings on such a target thus generate protons and/or electrons.

Particularly, a metal layer, having a thickness between 20 nanometers and 100 nanometers, is deposited on support 28, after which a second solid deuterium or dihydrogen layer, having a thickness between 20 nanometers and 100 nanometers, is deposited on the metal layer. The deposition of multiple materials on support 28 is for example performed by depositing the dihydrogen or deuterium layer on the metal layer once the plugs filling openings 30 have been removed and the second protection element has been placed against support 28.

The invention claimed is:

1. A method of manufacturing a target for the generation of radiation of photons or of particles by a laser, comprising:
    forming a support comprising a first surface, a second surface, and openings passing through the support from the first surface to the second surface; and
    forming in an enclosure a layer of material on the first surface of the support, wherein the forming of the layer of material on the support comprises:
    protecting the first surface of the support with a protection element;
    injecting into the enclosure a gas of filling material;
    adjusting the pressure in the enclosure and the temperature of the support to form solid plugs of the filling material in the openings of the support;
    stopping the injection of the gas of the filling material into the enclosure;
    maintaining the temperature of the support and the pressure in the enclosure at values to keep the plugs solid in the openings of the support and, while the temperature is maintained:
        withdrawing the protection element from the first surface of the support to expose the first surface; and
        forming the layer of material on the first surface of the support and on the solid plugs filling the openings; and
    modifying the conditions of pressure in the enclosure and of support temperature to clear the openings of the support of the solid plugs.

2. The method of manufacturing a target of claim 1, wherein the first surface of the support is planar, and the protection thereof comprises placing the first surface of the support against a planar solid surface.

3. The method of manufacturing a target of claim 1, wherein the forming of the solid plugs comprises adjusting the pressure in the enclosure to a predetermined pressure and cooling the support to a temperature lower than the temperature of the triple point of the material forming the gas.

4. The method of manufacturing a target of claim 1, wherein the layer of material is deposited on the first surface of the support by physical vapor deposition.

5. The method of manufacturing a target of claim 1, wherein the closure comprises an injection circuit that injects gas, means capable of adjusting the internal pressure thereof, means capable of adjusting the temperature of the support to temperatures lower than the triple point of the material forming the gas, and means capable of vaporizing a solid metal element placed in contact therewith, and wherein the placing into contact of the support with the gas, the forming of the plugs filling the openings of the support, and the physical vapor deposition are performed in the enclosure while maintaining a pressure lower than $10^{-3}$ mbar.

6. The method of manufacturing a target of claim 1, wherein the withdrawal of the protection element from the first surface of the support comprises heating said support to separate the element from the solid plugs filling the openings of the support and drawing the protection element away from the first surface of the support.

7. The method of manufacturing a target of claim 1, wherein the clearing of the openings of the support comprises adjusting the temperature of the support and/or the pressure of the gas to sublimate the solid plugs.

8. The method of manufacturing a target of claim 1, wherein the filling material is argon, nitrogen, krypton, or xenon.

9. The method of manufacturing a target of claim 1, wherein the layer of material is a metal layer.

10. The method of manufacturing a target of claim 9, wherein the thickness of the layer of material is smaller than or equal to 500 nanometers.

11. The method of manufacturing a target of claim 1, wherein the layer of material comprises a metal layer and a dihydrogen or deuterium layer.

12. The method of manufacturing a target of claim 11, wherein the metal layer has a thickness between 20 nanometers and 100 nanometers, and wherein the dihydrogen or deuterium layer has a thickness between 20 nanometers and 100 nanometers.

13. The method of manufacturing a target of claim 1, wherein the openings of the support are truncated cones widening from the first surface of the support to the second surface of the support.

14. The method of manufacturing a target of claim 1, wherein the openings of the support are arranged in a circle and angularly spaced apart in regular fashion.

15. The method of manufacturing a target of claim 9, wherein the thickness of the layer of material is smaller than or equal to 50 nanometers.

* * * * *